THERMOELECTRIC GENERATOR

Filed Aug. 26, 1957

INVENTOR.
Robert W. Fritts
BY Seegert & Schwalbach
Att'ys 2,906,801

THERMOELECTRIC GENERATOR

Robert W. Fritts, Elm Grove, Wis., assignor, by mesne assignments, to Minnesota Mining and Manufacturing Company, St. Paul, Minn., a corporation of Delaware Application August 26, 1957, Serial No. 680,064

16 Claims. (Cl. 136—4)

This invention relates to thermoelectric generators for low temperature applications.

Recent developments have provided new semi-metallic materials having high thermoelectric power and high conversion efficiencies compared to conventional metallic alloys. It is a general object of the present invention to utilize such semi-metallic materials in an improved thermoelectric generator operable at substantially reduced temperatures to generate a direct current of sufficient magnitude to actuate an electromagnetic control device, for example a relay.

The mechanical or physical strength of these new materials is such that they are able to withstand only small tensile or shearing stresses, although mild compressive loads can be supported indefinitely. With this in mind it is another object of the invention to provide an improved thermoelectric generator of the class described having means mounting the frangible semi-metallic elements thereof in a manner to render said elements resistant to fracture.

A more specific object of the invention is to provide an improved thermoelectric generator of the aforementioned character wherein the thermoelements thereof are placed under compressive stress and are individually housed within openings therefor in a housing member of deformable elastic material having low electrical and thermal conductivity.

Another specific object of the invention is to provide an improved thermoelectric generator of the class described having pressure contact means which maintain the circuit continuity even during displacement of the thermoelements within said housing openings.

Another object of the invention is to provide an improved thermoelectric generator of the character aforementioned which has embodied therein both P-type and N-type semi-metallic thermoelements.

Still another specific object of the invention is to provide an improved thermoelectric generator of the type aforestated utilizing therein a resilient metallic thermojunction member which functions both as an electrical conductor and as biasing means exerting a compressive stress on the associated thermoelements.

Another specific object of the invention is to provide an improved thermoelectric generator of the class described wherein the elastic deformable character of the housing for the thermoelements is utilized in cooperation with the resilient thermojunction member in providing biasing means compressively loading the thermoelements.

Other and further objects and advantages of the invention will become apparent as the description proceeds, reference being had to the drawing accompanying and forming a part of this specification wherein.

Figure 1:
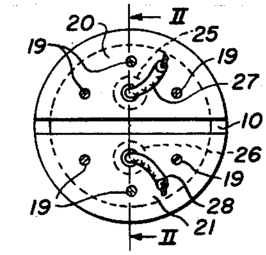
Figure 1 is an end view of one form of thermoelectric generator constructed in accordance with the principles of the present invention.
Figure 2:
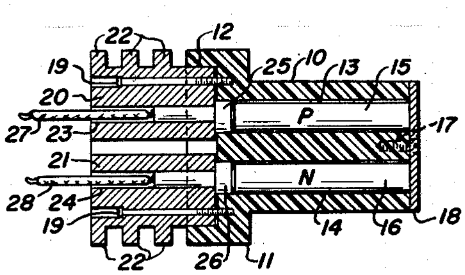
Figure 2 is a longitudinal vertical sectional view taken along the line II—II of Figure 1.
Figure 3:
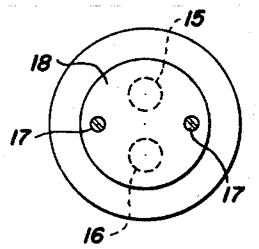
Figure 3 is an end view of the thermoelectric generator shown in Figures 1 and 2, said view being taken from the right-hand end of Figure 2.

Referring more particularly to Figures 1 to 3 of the drawing, the improved thermoelectric generator illustrated therein comprises a support 10 in the form of a cylindrical housing of the deformable elastic material having low thermal and electrical conductivity, an example of such material being polyethylene. The housing 10 is preferably cylindrical in shape and is formed at one end with a portion 11 of enlarged diameter which, in turn, is formed with a cylindrical end recess 12. The housing 10 is also formed with a pair of spaced axially extending bores 13 and 14.

Disposed within the bores 13 and 14 are elongated thermoelements 15 and 16 which preferably take the form of cylindrical ingots of P-type and N-type semi-metallic material, respectively, the opposite ends of which are preferably coated with a thin layer of lead-tin solder for contacting purposes. Overlaying the outer end of the housing 10 and anchored thereto as by screws 17 is thermojunction means in the form of a resilient metallic, for example, copper, plate 18 which has frictional engagement with and electrically joins the thermoelements 15 and 16.

Anchored to the housing 10 within the recess 12, as by screws 19, is contact and heat dissipating means comprising a pair of spaced semicylindrical blocks 20 and 21 of material having good thermal conductivity and low density, for example, aluminum. The blocks 20 and 21 are preferably formed with peripheral cooling fins 22, and said blocks are respectively bored at 23 and 24 coaxial with the bores 13 and 14 of the housing 10. The blocks 20 and 21 carry contact and thermojunction members 25 and 26 respectively, the member 25 having a stem portion disposed within the bore 23 and an enlarged cylindrical head portion disposed within the bore 13 of housing 10 and engaging the inner face of the block 20 as shown at the margin of the bore 23. The member 26 has a stem portion disposed within the bore 24 of the block 21 and has an enlarged cylindrical head portion disposed within the bore 14 of the housing 10 and engaging the inner surface of block 21 at the margin or bore 24 as shown. Suitable conductors 27 and 28 extend into the bores 23 and 24 and are electrically connected to the members 25 and 26, said conductors providing means for connecting the improved thermoelectric generator into a circuit (not shown) to be energized thereby.

It will be noted that the parts of the improved thermoelectric generator are of such a size and so related that the axial length of the thermoelement 15 plus that of the head of the member 25, and the corresponding axial length of thermoelement 16 and head of member 26 are somewhat greater than the axial length of the bores 13 and 14. As a result, when the screws 17 and 19 are drawn up, the housing 10 is placed under tensile stress and deforms somewhat by elongation, while at the same time the flexible thermojunction member 18 becomes somewhat deformed. As a result, the thermoelements 15 and 16 are placed under compressive stress between the plate 18 and the members 25 and 26. The thermojunction member 18 thus serves both as resilient biasing means and as conductor means electrically joining the thermoelements 15 and 16.

The compressive stress exerted on the thermoelements 15 and 16 serves not only to insure good electrical connection therewith at its ends, but it also renders said thermoelements resistant to fracture as a result of shock. Resistance of the thermoelements 15 and 16 to fracture is also provided by the fact that the bores 13 and 14 are somewhat larger than the outer diameter of said thermoelements, so that in the event of shock or deformation of the flexible housing 10, said thermoelements can displace laterally within the bores 13 and 14. When this occurs, continuity of the electrical circuit through the generator between the conductors 27 and 28 is maintained by sliding electrical contact of the ends of the thermoelements with the members 25, 26 and 18.

With more particular reference to the thermoelements 15 and 16, the N-type thermoelement 16 is preferably semi-metallic and may be formed, for example, of an alloy further described in the copending application of Sebastian Karrer, Serial No. 475,540, filed December 15, 1954, now U.S. Patent No. 2,811,570, and assigned to the assignee of the present application, said alloy comprising lead and at least one member of the group tellurium and selenium. For example, a thermoelement 16 of lead-selenium-tellurium composition could include a selenium-tellurium constituent in which the selenium is but a trace. In this case such constituent should constitute 35% to 38.05% by weight of the composition, the balance (61.95% to 65% by weight) being lead. At the other extreme, where the selenium-tellurium constituent consists almost entirely of selenium with but a trace of tellurium, such constituent should comprise 25% to 27.55% by weight of the final composition, the remainder (from 72.45% to 75% by weight) being lead. Between these two extremes, the selenium-tellurium constituent varies linearly with the ratio of selenium to tellurium (expressed in atom percent) in the selenium-teleurium constituent.

With regard to the aforementioned compositions it will be observed that in each case there is an excess of lead over and above the amount thereof necessary for satisfying the stoichiometric proportions of the compound formed in the second constituent or constituents, i.e., the tellurium or selenium. For example, the composition consisting substantially of lead and selenium can contain up to 10.4% lead by weight of the total composition over and above the 72.41% by weight lead stoichiometrically necessary for combination with selenium.

The electrical characteristics of the aforementioned semi-metallic alloys, desirable, for example in thermoelectric generator elements, can be markedly and advantageously altered in a reproducible manner by the addition thereto of controlled amounts of matter other than the constituents of the base composition. Such additions may also be denominated "beneficial impurities," as distinguished from undesirable impurities. For convenience, these additions are hereinafter designated "promoters," since they tend to enhance the electrical characteristic desired for the patricular application of the base compositions.

The abovedescribed base compositions exhibit negative thermoelectric power and negative conductivity. By the addition of certain "promoters," such negative properties may be enhanced, while the polarity of the electrical properties of the base composition may be reversed by the addition of certain other promoters to provide a semi-metallic composition having positive electrical characteristics and suitable for use as the P-type thermoelement 15. Suitable negative promoters are bismuth, tantalum, zirconium, titanium, gallium, bromine and iodine; while suitable positive promoters are sodium and potassium. The copending application of Robert W. Fritts and Sebastian Karrer, Serial No. 475,488, filed on December 15, 1954, now U.S. Patent No. 2,811,571, and assigned to the assignee of the present application, gives a complete description of the beneficial impurities, including both departures from perfect stoichiometry and promoters, which have been found to be effective for improvements of electrical properties of the semi-metallic thermoelectric generator elements when added to the aforementioned base compositions in minor amounts. For example, up to a maximum of 6.9% by weight of beneficial impurity, including 3.9% excess lead and 3.0% promoter.

The proportions and ranges of the various constituents aforementioned, and particularly the minimum limits of lead constituent in the compositions, must be regarded as critical if the composition is to have the electrical and physical properties desired. If the lead content is significantly less than the minimum amount indicated for any particular selenium-tellurium proportion, the polarity of Seeback e.m.f. changes, and the desired electrical and mechanical properties will not be reproducible. On the other hand, if the lead content of any composition appreciably exceeds the aforementioned maximum limits, the resulting composition is too metallic in nature to afford satisfactory energy conversion efficiencies.

Not only are the proportions and ranges of the aforedescribed compositions to be considered critical, but so also is the purity. More specifically, the limit of tolerable metallic impurity in non-promoted final compositions has been found to be of the order of 0.01%, and the composition must be substantially oxygen-free, if the mechanical and electrical properties desired are to be obtained and are to be reproducible. In the case of promoted compositions, however, the limit of tolerable impurities is 0.001%.

In the use of the improved thermoelectric generator, the thermojunction member 18 provides a hot thermojunction, whereas the members 25 and 26 provide cold thermojunctions. The low thermal conductivity of the housing 10 prevents conduction of substantial amounts of heat therethrough from the hot thermojunction to the cold thermojunctions and thereby enhances the efficiency of the generator. While the thermojunction member 18 may be of any desired thickness, it is preferred to have said member relatively thin so that it has relatively low heat capacity and affords the generator a relatively high sensitivity to hot junction temperature changes.

Thermoelectric generators constructed as shown in Figures 1 to 3 generate sufficient electrical energy to actuate relay-type devices, including electromagnetic valves, when subjected to a temperature differential of as low as 150 to 200 degrees Fahrenheit between the hot and cold thermojunctions thereof. More specifically, a thermoelectric generator of the type shown in Figures 1 to 3 was found to generate sufficient electrical energy to actuate a relay when the thermojunction member 18 was placed against a metal block heated at 280° F. Under these conditions, the voltage output of said generator was 35 millivolts and the internal resistance was .045 ohm.

Figures 4 to 7 illustrate another form of thermoelectric generator constructed in accordance with the principles of the present invention, the illustrated generator taking the form of a four element thermopile. In Figures 4 to 7 the elements indicated by reference numerals either primed or bearing a suffix correspond to parts in Figures 1 to 3 indicated by the same reference numerals unprimed and without a suffix. In Figures 4 to 7, the housing 10' is formed with four spaced axially extending bores **13*a*, 13*b*, 14*a* and 14*b*. P-type thermoelements 15*a* and 15*b* are disposed respectively in the bores 13*a* and 14*b*, and N-type thermoelements 16*a* and 16*b* are disposed respectively in the bores 13*b* and 14*a***.

A semicircular thermojunction member **18*a* is anchored to the end of the housing 10', as by screws 17', and frictionally engages the thermoelements 15*a* and 16*a* to electrically join the same and afford a hot thermojunction. A semicircular thermojunction member 18b spaced from the member 18a is anchored to the end of the housing 10', as by screws 17', and frictionally engages the thermoelements 15b and 16b to electrically join the same and form a hot thermojunction separate from that formed by the thermojunction member 18a. The thermojunction members 18a and 18b are preferably relatively thin and are made of resilient metal, for example, copper, said members functioning both as thermojunction members and as biasing means similarly to the dual functions of the member 18** in Figures 1 to 3.

Figure 4:
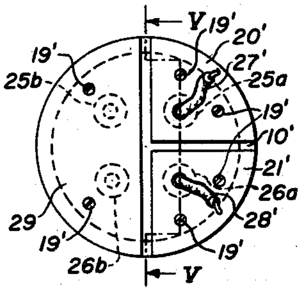
Figure 4 is an end view similar to Figure 1 of another form of thermoelectric generator constructed in accordance with the principles of the present invention.
Figure 5:
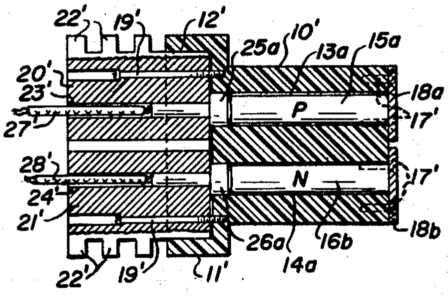
Figure 5 is a longitudinal vertical sectional view taken along the line V—V of Figure 4.
Figure 6:
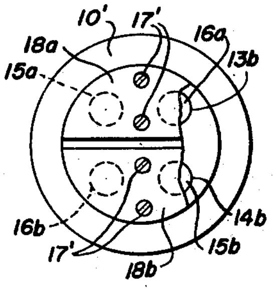
Figure 6 is an end view of the thermoelectric generator shown in Figures 4 and 5, said view being taken from the right of Figure 5 and parts being broken away.
Figure 7:
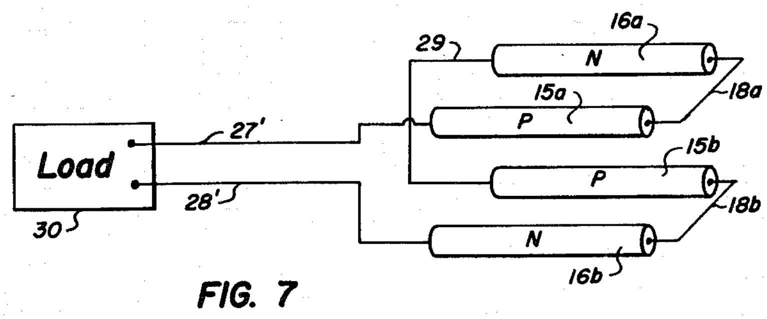
Figure 7 is a schematic view of the electrical circuit of the thermoelectric generator shown in Figures 4 to 6 connected in circuit with a load.

Referring to Figures 4 and 5, cold thermojunction and heat dissipating means is provided and comprises a pair of members 20' and 21' which are quadrantal in end view as shown in Figure 4 and are anchored to the housing 10' by screws 19'. The members 20' and 21' carry contact and thermojunction members 25' and 26' disposed respectively within the bores 13a and 14a of housing 10' in frictional contact with the adjacent ends of the thermoelements 15a and 16b as shown. The cold thermojunction and heat dissipating means also comprises a semicylindrical member 29 also anchored to the housing 10' by screws 19' and spaced from the members 20' and 21'. The member 29 may carry contact and thermojunction members 25b and 26b (see Figure 4) disposed within the bores 13b and 14b and frictionally engaging the thermoelements 16a and 15b respectively in the same manner that the members 25a and 26a engage thermoelements 15a and 16b in Figure 5. The members 29, 25b and 26b thus provide cold thermojunction means electrically joining the thermoelements 16a and 15b. Conductors 27' and 28' are connected in circuit with members 25a and 26a as shown in Figure 5 and provide means for connecting the thermopile to a load 30 as shown schematically in Figure 7. As also shown in Figure 7, the thermoelements 15a, 16a, 15b and 16b are electrically connected to provide an open ended series circuit to which the conductors 27' and 28' are connected.

As in the form of the invention shown in Figures 1 to 3, the dimensions of the parts are such that when the thermopile structure is assembled, the elastic housing 10' is deformed as a result of being placed under tensile stress, and the resilient thermojunction members 18a and 18b are also somewhat deformed, all of the thermoelements 15a, 15b, 16a and 16b being thereby subjected to compressive stress to render the same resistant to fracture.

As in the form of the invention shown in Figures 1 to 3, the thermoelements of the thermopile structure are of smaller diameter than their respective bores to permit lateral movement thereof within said bores in response to shock or deformation of the housing 10'. During such displacement the continuity of the electrical circuit is maintained by sliding electrical contact of the displacing thermoelement with respect to its respective thermojunction members.

Various other changes and modifications may be made without departing from the spirit of the invention, and all of such changes are contemplated as may come within the scope of the appended claims.

What is claimed as the invention is:

1. A thermoelectric generator comprising a pair of thermoelements, a support for said thermoelements, and means including a resilient metallic thermojunction member electrically joining said thermoelements to provide a thermojunction, said resilient member also being operatively associated with said support and exerting a compressive stress on said thermoelements.

2. A thermoelectric generator comprising a P-type semi-metallic thermoelement and an N-type semi-metallic thermoelement, a support for said thermoelements, and means including a resilient metallic thermojunction member frictionally engaging and thereby electrically joining said thermoelements to provide a thermojunction, said resilient member also being operatively associated with said support and exerting a compressive stress on said thermoelement.

3. A thermoelectric generator comprising a pair of elongated thermoelements, a support for said thermoelements, means including a resilient metallic thermojunction member electrically joining one end of one of said thermoelements to one end of the other to provide a hot thermojunction, and terminal and heat dissipating means electrically joined to the other ends of said thermoelements to form cold thermojunctions therewith, said terminal and heat dissipating means and said resilient member also being operatively associated with said support to exert a compressive stress on said thermoelements.

4. A thermoelectric generator comprising a pair of elongated thermoelements, a support for said thermoelements permitting limited lateral movement of said thermoelements with respect thereto, means including a thermojunction member frictionally engaging and electrically joining one end of one of said thermoelements and one end of the other to provide a hot thermojunction, and terminal and heat dissipating means frictionally engaging and electrically joined to the other ends of said thermoelements to form cold thermojunctions therewith, said terminal and heat dissipating means and said thermojunction member being anchored to said support, and the frictional engagement of said thermoelements with said terminal and heat dissipating means and said resilient thermojunction member affording a sliding electrical contact therebetween maintaining continuity of the electrical circuit thereat during said lateral movement of said thermoelements.

5. A thermoelectric generator comprising a pair of elongated thermoelements, a support for said thermoelements permitting limited lateral movement of said thermoelements with respect thereto, means including a resilient thermojunction member frictionally engaging and electrically joining one end of one of said thermoelements and one end of the other to provide a hot thermojunction, and terminal and heat dissipating means frictionally engaging and electrically joined to the other ends of said thermoelements to form cold thermojunctions therewith, said terminal and heat dissipating means and said resilient thermojunction member being anchored to said support, said thermojunction member functioning as biasing means exerting a compressive stress on said thermoelements, the frictional engagement of said thermoelements with said terminal and heat dissipating means and said resilient thermojunction member affording a sliding electrical contact therebetween maintaining continuity of the electrical circuit thereat during said lateral movement of said thermoelements.

6. A thermoelectric generator comprising a housing of material having low thermal and electrical conductivity formed with at least two through openings, a thermoelement in each of said openings, contact means carried by said housing at one end of said openings frictionally engaging said thermoelements, and thermojunction means carried by said housing at the opposite end of said openings frictionally engaging a pair of said thermoelements to electrically join the same and form a thermojunction.

7. A thermoelectric generator comprising a housing of material having low thermal and electrical conductivity formed with at least two through openings, a thermoelement in each of said openings, contact means carried by said housing and frictionally engaging said thermoelements at one end of said openings, and means including a resilient thermojunction member carried by said housing and frictionally engaging said thermoelements at the opposite end of said openings to electrically join said thermoelements to form a thermojunction, said resilient thermojunction member also functioning as biasing means exerting a compressive stress on said thermoelements.

8. A thermoelectric generator comprising a housing of material having low thermal and electrical conductivity formed with at least two through openings, a thermoelement in each of said openings, said thermoelements being of a size permitting limited lateral movement thereof within said openings, contact means carried by said housing and frictionally engaging said thermoelements at one end of said openings, and means including a thermojunction member carried by said housing and frictionally engaging said thermoelements at the opposite end of said openings to electrically join said thermoelements to form a thermojunction, the frictional engagement of said thermoelements with said contact means and said thermojunction member affording sliding electrical contact therebetween maintaining continuity of the electrical circuit thereat during said lateral movement of said thermoelements.

9. A thermoelectric generator comprising a housing of material having low thermal and electrical conductivity formed with at least two through openings, a thermoelement in each of said openings, said thermoelements being of a size permitting limited lateral movement thereof within said openings, contact means carried by said housing and frictionally engaging said thermoelements at one end of said openings, and means including a resilient thermojunction member carried by said housing and frictionally engaging said thermoelements at the opposite end of said openings to electrically join said thermoelements to form a thermojunction, said resilient thermojunction member also functioning as biasing means exerting a compressive stress on said thermoelements, the frictional engagement of said thermoelements with said contact means and said thermojunction member affording sliding electrical contact therebetween maintaining continuity of the electrical circuit thereat during said lateral movement of said thermoelements.

10. A thermoelectric generator comprising a plurality of elongated P-type and N-type semi-metallic thermoelements, a housing of material having low thermal and electrical conductivity formed with spaced substantially parallel bores therethrough, said thermoelements being disposed respectively within said bores, thermojunction means at each end of said bores anchored to said housing and comprising a plurality of thermojunction members each frictionally engaging and electrically joining adjacent end portions of two dissimilar thermoelements to form a thermojunction therewith, said thermojunction means connecting all of said thermoelements in an open ended series circuit to form a thermopile, and contact means anchored to one end of said housing and frictionally engaging the adjacent end portions of two thermoelements constituting the open ends of said series circuit.

11. A thermoelectric generator comprising a pair of thermoelements, a support for said thermoelements, said support being formed of deformable elastic material, thermojunction means anchored to said support and having a force transmitting electrical connection joining said thermoelements to form a thermojunction, and contact means also anchored to said support and having force transmitting electrical connections with said thermoelements, the normal unstressed length of said support between the points at which said contact means and said thermojunction means are anchored thereto being less than the spacing between the anchoring portions of both said means before effectuation of such anchoring, wherefore anchoring of both said means to said support places said support under tensile stress deforming the latter, and at the same time places said thermoelements under reactive compressive stress.

12. A thermoelectric generator comprising a pair of thermoelements, a housing for said thermoelements formed with a pair of spaced parallel bores therethrough, said housing being formed of deformable elastic material, thermojunction means anchored to said housing and having a force transmitting electrical connection joining said thermoelements to form a thermojunction at one end of said bores, and contact means anchored to said housing and having force transmitting connection with said thermoelements at said other end of said bores, the normal unstressed length of said housing between the points at which said contact means and said thermojunction means are anchored thereto being less than the spacing between the anchoring portions of both said means before effectuation of said anchoring, wherefore anchoring of both said means to said housing places said housing under tensile stress deforming the latter, and at the same time places said thermoelements under reactive compressive stress.

13. A thermoelectric generator comprising a housing of material having low thermal and electrical conductivity formed with at least two openings, a thermoelement in each of said openings, contact means carried by said housing at one end of said openings electrically joined to said thermoelements, and thermojunction means carried by said housing at the opposite end of said openings electrically joining a pair of said thermoelements to form a thermojunction.

14. A thermoelectric generator comprising a housing of material having low thermal and electrical conductivity formed with at least two openings, a thermoelement in each of said openings, contact means carried by said housing and electrically joined to said thermoelements at one end of said openings, and means including a resilient thermojunction member carried by said housing at the opposite end of said openings and electrically joining said thermoelements to form a thermojunction, said resilient thermojunction member also functioning as biasing means exerting a compressive stress on said thermoelements.

15. A thermoelectric generator comprising a housing of material having low thermal and electrical conductivity formed with at least two bores, a thermoelement in each of said openings, contact means electrically joined to one end of said thermoelements, and a thermojunction member electrically joining a pair of said thermoelements at the opposite end thereof to form a thermojunction, said thermojunction member overlaying the adjacent end of said housing and having a width substantially greater than the diameter of said bores to provide an enlarged exposed surface area for absorption of radiant as well as convectional heat.

16. A thermoelectric generator comprising a housing of material having low thermal and electrical conductivity formed with at least two bores, a thermoelement in each of said openings, contact means electrically joined to one end of said thermoelements, and means including a resilient thermojunction member electrically joining said thermoelements at the opposite end thereof to form a thermojunction, said thermojunction member overlaying the adjacent end of said housing and having a width substantially greater than the diameter of said bores to provide an enlarged exposed surface area for absorption of radiant as well as convectional heat, said resilient thermojunction member also being anchored to said housing and functioning as biasing means exerting a compressive stress on said thermoelements.

References Cited in the file of this patent

UNITED STATES PATENTS 2,152,153 Ridgway ______________ Mar. 28, 1939